United States Patent
Chiang et al.

(10) Patent No.: US 6,660,593 B2
(45) Date of Patent: Dec. 9, 2003

(54) METHOD FOR FABRICATING OXIDE LAYERS WITH DIFFERENT THICKNESSES

(75) Inventors: Shing-Sing Chiang, Hsinchu Hsien (TW); Kuo-Shi Teng, Taipei Hsien (TW); Hao-Chieh Yung, Hsinchu (TW); Yi-Shi Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/747,374

(22) Filed: Dec. 21, 2000

(65) Prior Publication Data

US 2002/0081798 A1 Jun. 27, 2002

(51) Int. Cl.[7] ............................................. H01L 21/00
(52) U.S. Cl. ........................................ 438/275; 438/769
(58) Field of Search ................................. 438/769, 981, 438/165, 494, 911, 275

(56) References Cited

U.S. PATENT DOCUMENTS

| | | | | |
|---|---|---|---|---|
| 5,254,489 A | * | 10/1993 | Nakata | 148/DIG. 112 |
| 5,330,920 A | * | 7/1994 | Soleimani et al. | 148/DIG. 118 |
| 5,480,828 A | * | 1/1996 | Hsu et al. | 438/275 |
| 6,063,670 A | * | 5/2000 | Lin et al. | 257/406 |
| 6,177,312 B1 | * | 1/2001 | He et al. | 438/257 |
| 6,235,590 B1 | * | 5/2001 | Daniel et al. | 438/275 |

* cited by examiner

Primary Examiner—William David Coleman
(74) Attorney, Agent, or Firm—J.C. Patents

(57) ABSTRACT

A method for fabricating oxide layers with different thicknesses on a substrate is described. A field oxide layer is formed on the substrate to define a first active region and a second active region therebetween. A first oxide layer is formed over the first active region. A thin oxynitride layer is formed on the first oxide layer. The substrate is oxidized to form a second oxide layer over the second active region, wherein the second oxide layer has a thickness different from the thickness of the first oxide layer,

6 Claims, 3 Drawing Sheets

METHOD FOR FABRICATING OXIDE LAYERS WITH DIFFERENT THICKNESSES

BACKGROUND OF THE INVENTION

1. Field of the Invention

This invention relates to a manufacturing process for integrated circuits, and more particularly, to a method for fabricating oxide layers with different thicknesses on a substrate.

2. Description of Related Art

Semiconductor chips typically have gate oxide layers of a single thickness. However, there is still a need for gate oxide layers with varied thicknesses on a single chip. For example, the input-output drivers are often operated at about 5V, which is a higher supply of voltage entering from and external source to the chip. Some devices of the input-output drivers are provided with a thicker gate oxide layer than that used in other devices on the chip because of operational speed requirements.

SUMMARY OF THE INVENTION

Accordingly, the present invention provides a method for fabricating oxide layers with different thicknesses on a substrate.

To achieve these objects and advantages, and in accordance with the purpose of the invention, as embodied and broadly described herein, the invention provides a method for fabricating oxide layers of different thicknesses on a substrate. A field oxide layer is formed on the substrate to define a first active region and a second active region therebetween A first oxide layer is formed over the first and the second active regions. Impurities are implanted into the upper portion of the first oxide layer. The impurities depress the oxidation rate of the first oxide layer. The first oxide layer within the second active region is removed. Most of the upper portion of the first oxide layer is removed, thereby leaving a thin doped oxide layer on the lower portion of the first oxide layer. The substrate is oxidized to form a second oxide layer over the second active region. The second oxide layer has a thickness different from the thickness of the lower portion of the first oxide layer. After removing the thin doped oxide layer, the lower portion of the first oxide layer is exposed and becomes a third oxide layer. The thickness of the third oxide layer is different from that of the second oxide layer, and the thickness difference between them is controlled by the implantation of the impurities.

The oxide layers with different thicknesses are broadly used in a variety of semiconductor devices. The oxide layers with different thicknesses in this invention are applicable to transistors having different operating voltages in the same device. In this application, the thinner of the oxide layers serves as the gate oxide of the low voltage transistor, while the thicker of the oxide layers serves as the gate oxide of the high voltage transistor. The invention provides a method for fabricating oxide layers with different thicknesses. The thickness difference between the oxide layers can be easily controlled. The invention also provides a method of simultaneously forming different gate oxides for transistors having different operating voltages in the same device.

It is to be understood that both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention is disclosed in the following with reference to FIGS. 1A–1I.

Figure 1A:
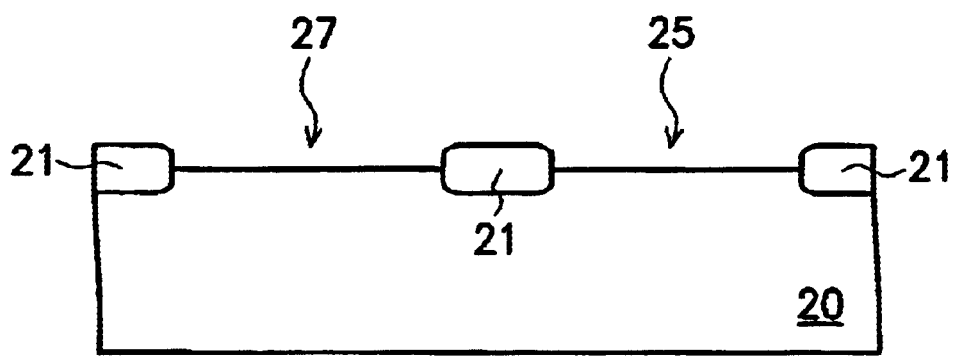
FIGS. 1A–1I are schematic, cross-sectional views which illustrate the formation of oxide layers according to the present invention.

Referring to FIG. 1A, a field oxide layer 21 is formed on a predetermined region of a substrate 20 to define a first active region 25 and a second active region 27. The field oxide layer 21 is formed by, for example, a localized oxidation isolation method or a shallow trench isolation method. The substrate 20 is typically a silicon substrate.

Figure 1B:
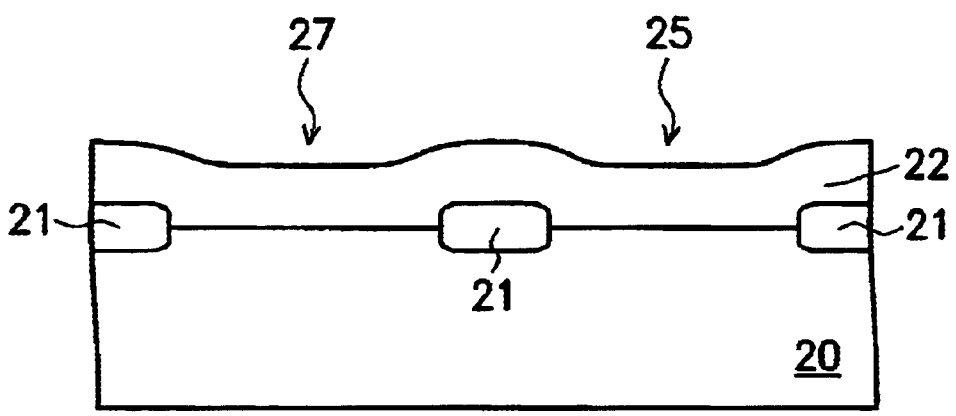

Referring to FIG. 1B, an oxide layer 22 with a thickness of about 150 to 250 angstroms is formed over the substrate 20. The oxide layer 22 is formed by, for example, a thermal oxidation method.

Figure 1C:
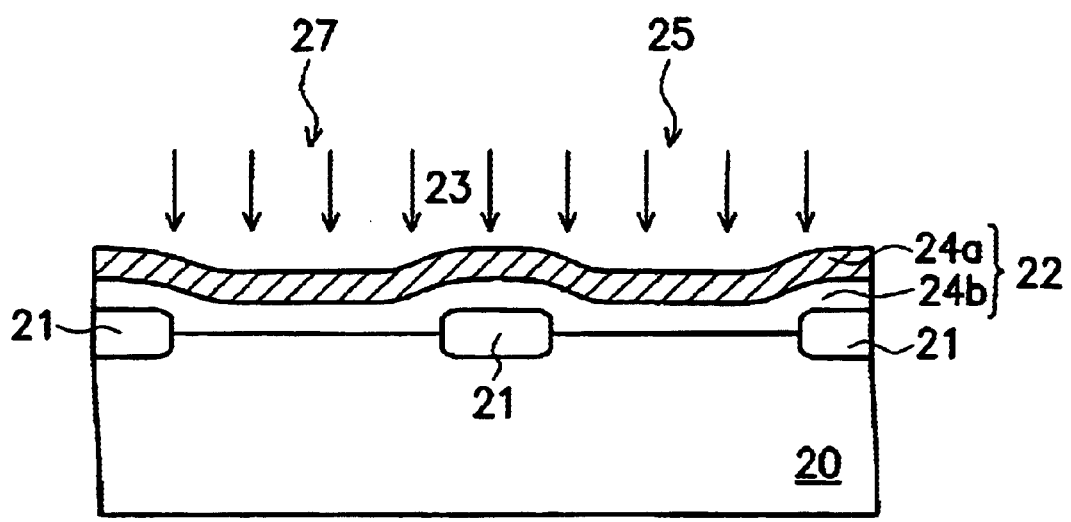

Referring to FIG. 1C, impurities 23 comprising nitrogen are implanted into the upper portion 24a of the oxide layer 22. The impurities 23 comprising nitrogen can depress the oxidation rate of the oxide layer 22. The implant depth controlled by the implant energy depends on the desired thickness of the lower portion 24b of the oxide layer 22. The implant energy is between about 5 and 10 KeV. After the nitrogen implantation is completed, the oxide layer 22 comprises a hard oxynitride layer 24a and a soft oxide layer 24b covered by the hard oxynitride layer 24a.

It should be noted that the impurities 23 implanted into the oxide layer 22 are not limited to the nitrogen. They can comprise other impurities which are able to depress the oxidation rate of the oxide layer 22.

Figure 1D:
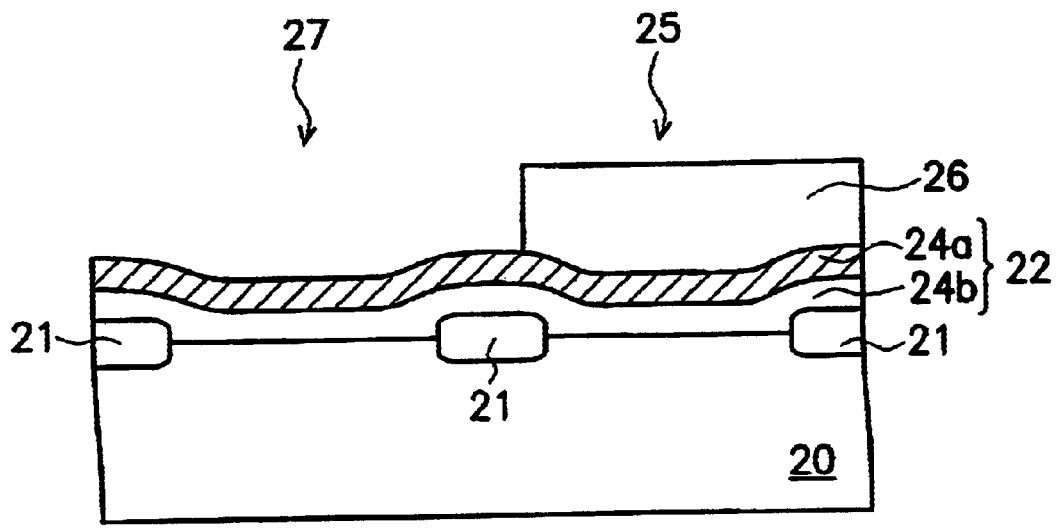

Referring to FIG. 1D, a photoresist layer 26 is formed on a part of the hard oxynitride layer 24a to mask the first active region 25.

Figure 1E:
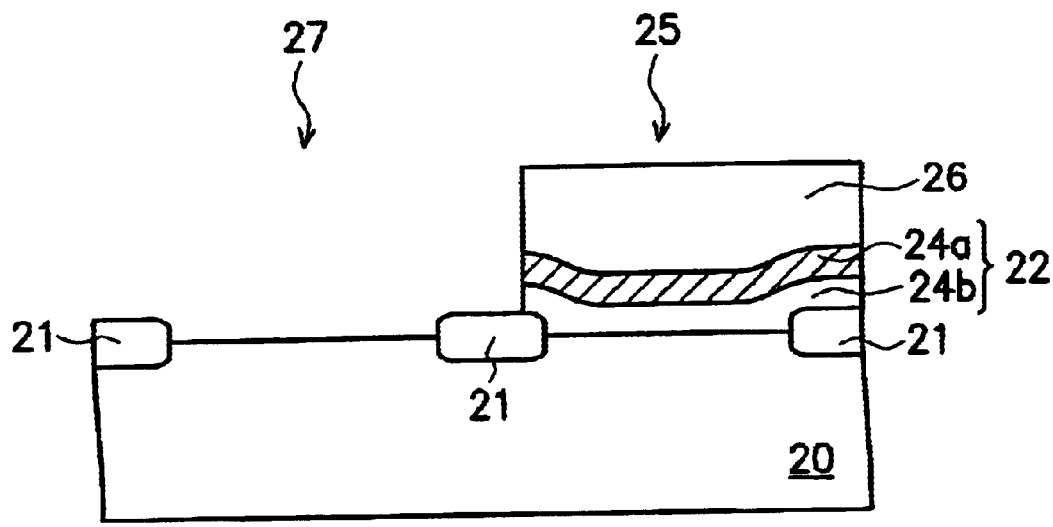

Referring to FIG. 1E, using the photoresist layer 26 as a mask, the oxide layer 22 over the second active region 27 is removed by, for example, time-controlled wet etching. The etchant used in the wet etching is, for example, a 50:1 BOE (buffer oxide etching) solution or a hot phosphoric acid solution.

Figure 1F:
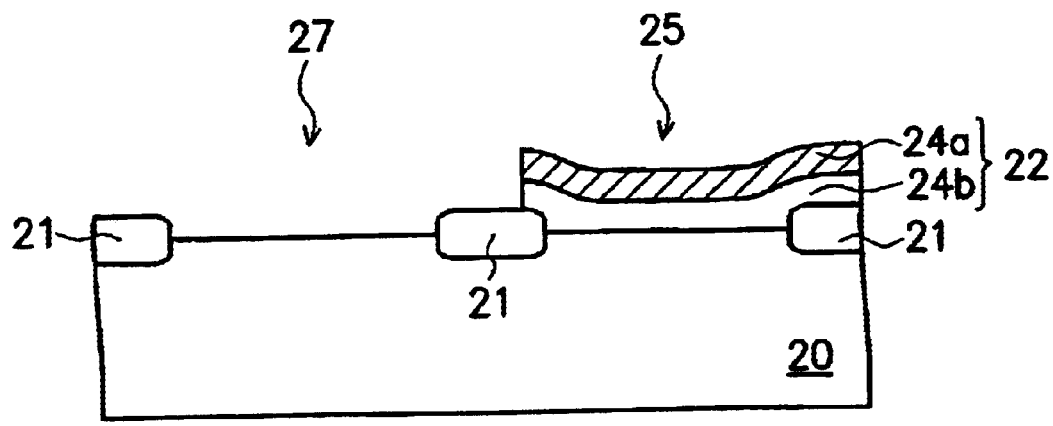

Referring to FIG. 1F, the photoresist layer 22 (shown in FIG. 1E) is removed with, for example, plasma.

Figure 1G:
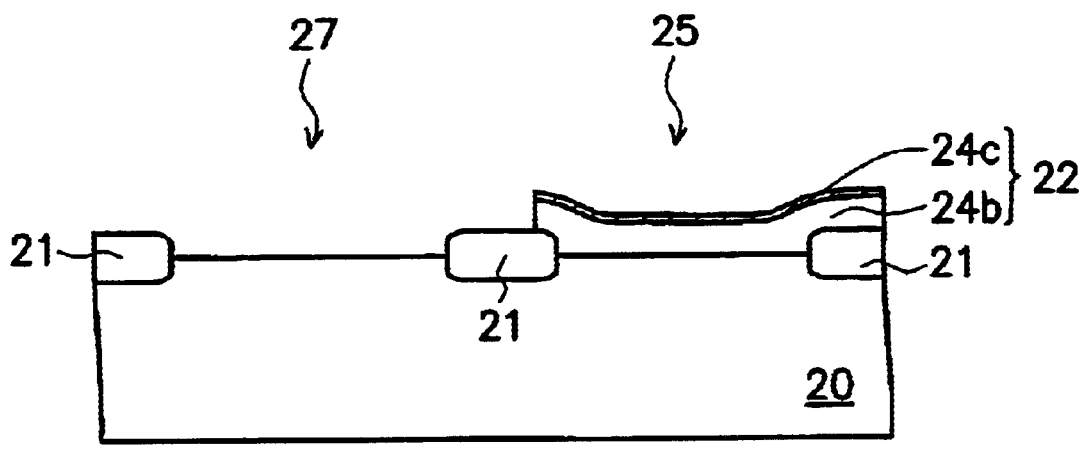

Referring to FIG. 1G, most of the hard oxynitride layer 24a (shown in FIG. 1F) is removed with, for example, a BOE solution. However, a thin oxynitride layer 24c still remains on the soft oxide layer.

Figure 1H:
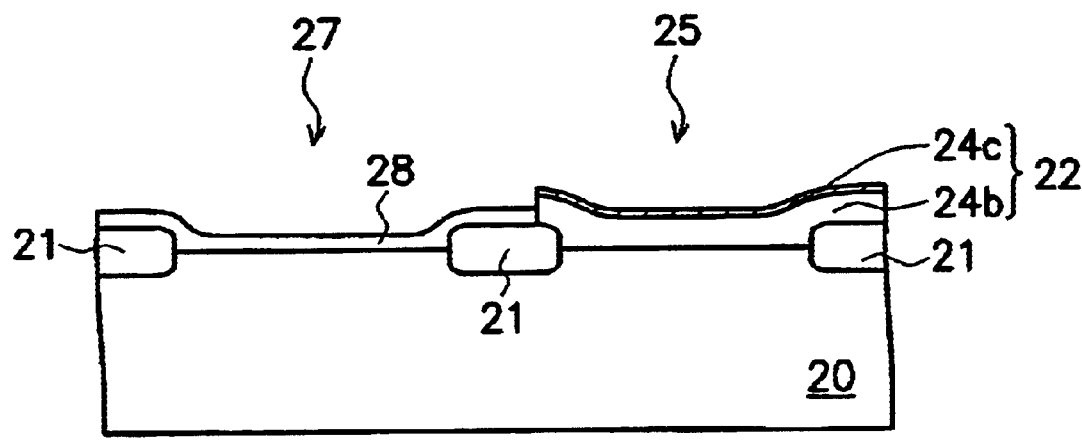

Referring to FIG. 1H, an oxide layer 28 is grown over the second active region 27. The oxide layer 28 can be grown by a variety of methods known to those skilled in the art. Preferably, it is grown by oxidizing the substrate 20. In this oxidation the growing rate on the oxide layer 22 over the first active region 25 is very slow. This is because the thin oxynitride layer 24c of the oxide layer 22 is hard, and the implant impurities comprising nitrogen depress the oxidation rate of the oxide layer 22. In contrast, the oxide layer 28 grown from the second active region 27 is oxidized very fast compared to the oxide layer 22 over the first active region 25. The oxide layer 28 is formed of a thickness different from that of the soft oxide layer 24b over the first active region 25. The thickness difference between them can be controlled by the implantation of the impurities in the oxide layer 22.

Figure 1I:
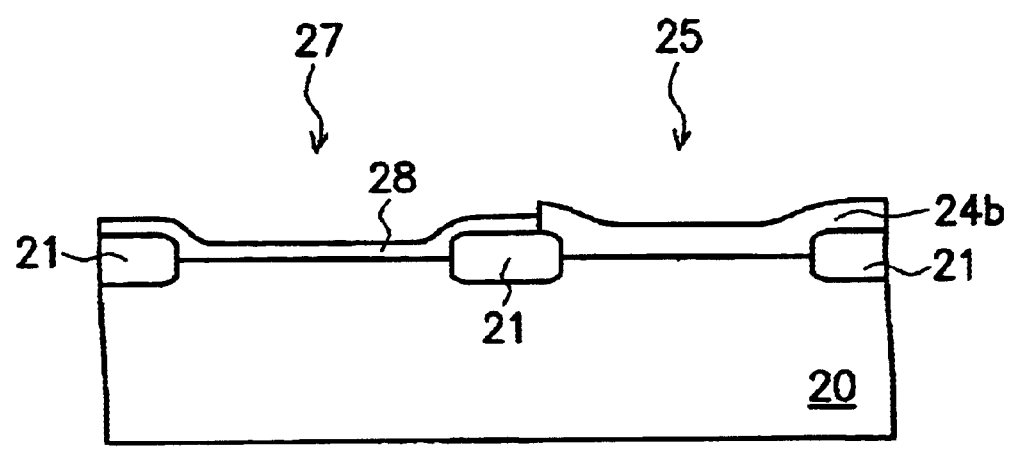

Referring to FIG. 1I, the thin oxynitride layer 24c (shown in FIG. 1H) is removed with, for example, a hot phosphoric acid solution. It is removed for the insulation issues of the soft oxide layer 24b and the reliability of the gate subsequently formed on the soft oxide layer 24b. After the thin oxynitride layer 24c is removed, the oxide layers 24b, 28 with different thicknesses on the substrate 20 are achieved.

The oxide layers with different thicknesses are broadly used in a variety of semiconductor devices. For example, they can be used in terms of reliability considerations in mixing a 3.3 and a 5 volts transistors in the same device. In this example, the thinner of the oxide layers serves as the gate oxide of the 3.3 volts transistor, while the thicker of them serves as the gate oxide of the 5 volts transistor. Other parts of the transistors, such as the gates, source and drain regions are formed by a variety of methods known to those skilled in the art.

The invention has been described using exemplary preferred embodiments. However, it is to be understood that the scope of the invention is not limited to the disclosed embodiments. On the contrary, it is intended to cover various modifications and similar arrangements. For example, the oxide layers with different thicknesses are also applicable to the devices which require two different threshold voltages, such as read only memory (ROM) devices. The scope of the claims, therefore, should be accorded the broadest interpretation so as to encompass all such modifications and similar arrangements,

What is claimed is:

1. A method for fabricating oxide layers of different thicknesses on a substrate, comprising:

forming a field oxide layer on the substrate to define a first active region and a second active region therebetween;

forming a first oxide layer over the first and the second active regions;

implanting impurities into an upper portion of the first oxide layer, wherein the impurities depress the oxidation rate of the first oxide layer;

removing the first oxide layer within the second active region;

removing most of the upper portion of the remaining the first oxide layer within the first active region, thereby leaving a thin implanted oxide layer on a remaining portion of said first oxide layer; and oxidizing the substrate to form a second oxide layer over the second active region, wherein the second oxide layer has a thickness different from the thickness of the lower portion of the first oxide layer.

2. The method of claim 1, wherein the step of removing the first oxide layer within the second active region comprises:

forming a photoresist layer on the first oxide layer to mask the first active region;

etching the first oxide layer by using the photoresist layer as an etching mask so as to remove the first oxide layer on the second active region; and removing the photoresist layer.

3. The method of claim 1, further comprising the step of removing the thin implanted oxide layer.

4. The method of claim 1, wherein the first oxide layer has a thickness of about 150 to 250 angstroms.

5. The method of claim 1, wherein the impurities comprise nitrogen.

6. The method of claim 5, wherein the implant energy for the step of implanting the impurities is between about 5 to about 10 KeV.

* * * * *